United States Patent
Carlson et al.

(10) Patent No.: US 10,388,667 B2
(45) Date of Patent: *Aug. 20, 2019

(54) MEMORY CELLS, INTEGRATED STRUCTURES AND MEMORY ARRAYS

(71) Applicant: Micron Technology, Inc., Boise, ID (US)

(72) Inventors: Chris M. Carlson, Nampa, ID (US); M. Jared Barclay, Middleton, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/102,987

(22) Filed: Aug. 14, 2018

(65) Prior Publication Data

US 2018/0358377 A1    Dec. 13, 2018

Related U.S. Application Data

(63) Continuation of application No. 15/409,412, filed on Jan. 18, 2017, now Pat. No. 10,128,265.

(51) Int. Cl.
*H01L 27/11582* (2017.01)
*H01L 27/1157* (2017.01)
(Continued)

(52) U.S. Cl.
CPC .. *H01L 27/11582* (2013.01); *H01L 21/28282* (2013.01); *H01L 27/1157* (2013.01);
(Continued)

(58) Field of Classification Search
CPC ........... H01L 27/11582; H01L 27/1157; H01L 29/4234; H01L 29/512; H01L 29/7926
See application file for complete search history.

(56) References Cited

U.S. PATENT DOCUMENTS

| 8,208,300 B2 | 6/2012 | Eitan et al. |
| 8,324,060 B2 | 12/2012 | Park et al. |

(Continued)

FOREIGN PATENT DOCUMENTS

KR    10-0777016    11/2007

OTHER PUBLICATIONS

WO PCT/US2017/069113 Search Rept., dated Apr. 23, 2018, Micron Technology, Inc.

(Continued)

*Primary Examiner* — Christine A Enad
(74) *Attorney, Agent, or Firm* — Wells St. John P.S.

(57) ABSTRACT

Some embodiments include a memory cell which has, in the following order; a control gate, charge-blocking material, charge-trapping material, a first oxide, a charge-passage structure, a second oxide, and channel material. The charge-passage structure has a central region sandwiched between first and second regions. The central region has a lower probability of trapping charges and/or a lower rate of trapping charges than the first and second regions. Some embodiments include an integrated structure having a vertical stack of alternating conductive levels and insulative levels, and having a charge-passage structure extending vertically along the vertical stack. Some embodiments include a NAND memory array having a vertical stack of alternating insulative levels and wordline levels, and having a charge-passage structure extending vertically along the vertical stack.

20 Claims, 3 Drawing Sheets

(51) Int. Cl.
    *H01L 29/423*     (2006.01)
    *H01L 29/51*     (2006.01)
    *H01L 29/792*     (2006.01)
    *H01L 21/28*     (2006.01)

(52) U.S. Cl.
    CPC ........ *H01L 29/4234* (2013.01); *H01L 29/512* (2013.01); *H01L 29/518* (2013.01); *H01L 29/7926* (2013.01)

(56) References Cited

U.S. PATENT DOCUMENTS

| | | | |
|---|---|---|---|
| 8,637,921 B2 | 1/2014 | Levy | |
| 9,443,866 B1* | 9/2016 | Sakakibara | ....... H01L 27/11582 |
| 2006/0281260 A1* | 12/2006 | Lue | ................... G11C 16/0475 438/264 |
| 2010/0157680 A1* | 6/2010 | Higuchi | ........... H01L 21/28282 365/185.18 |
| 2011/0281429 A1 | 11/2011 | Ganguly et al. | |
| 2014/0269078 A1 | 9/2014 | Hsiao et al. | |
| 2015/0279955 A1* | 10/2015 | Choi | ..................... H01L 29/513 257/324 |
| 2015/0325589 A1 | 11/2015 | Hopkins | |
| 2016/0284723 A1* | 9/2016 | Rabkin | ............. H01L 27/11582 |
| 2016/0307916 A1 | 10/2016 | Chen et al. | |
| 2016/0315095 A1* | 10/2016 | Sel | .......................... H01L 29/04 |
| 2017/0186755 A1* | 6/2017 | Lai | ..................... H01L 27/1157 |
| 2018/0040627 A1 | 2/2018 | Kanakamedala et al. | |
| 2018/0097008 A1 | 4/2018 | Zhang et al. | |

OTHER PUBLICATIONS

WO PCT/US2017/069113 Writ. Opin., dated Apr. 23, 2018, Micron Technology, Inc.

Gilmer et al., "Band Engineered Tunnel Oxides for Improved TANOS-type Flash Program/Erase with Good Retention and 100K Cycle Endurance", IEEE, 2009, United States, pp. 156-157.

Lu et al., "State-of-the-Art Flash Memory Devices and Post-Flash Emerging Memories", Science China Information Sciences, vol. 54, No. 5, May 2011, China, pp. 1039-1060.

Lue et al., "Scaling Evaluation of BE-SONOS NAND Flash Beyond 20 nm", IEEE Symposium on VLSI Technology Digest of Technology Papers, 2008, United States, pp. 116-117.

Robertson, "Band Offsets of Wide-Band-Gap Oxides and Implications for Future Electronic Devices", Journal of Vacuum Science & Technology B: Microelectronics and Nanometer Structures, vol. 18, No. 3, May/Jun. 2000, United States, pp. 1785-1791.

\* cited by examiner

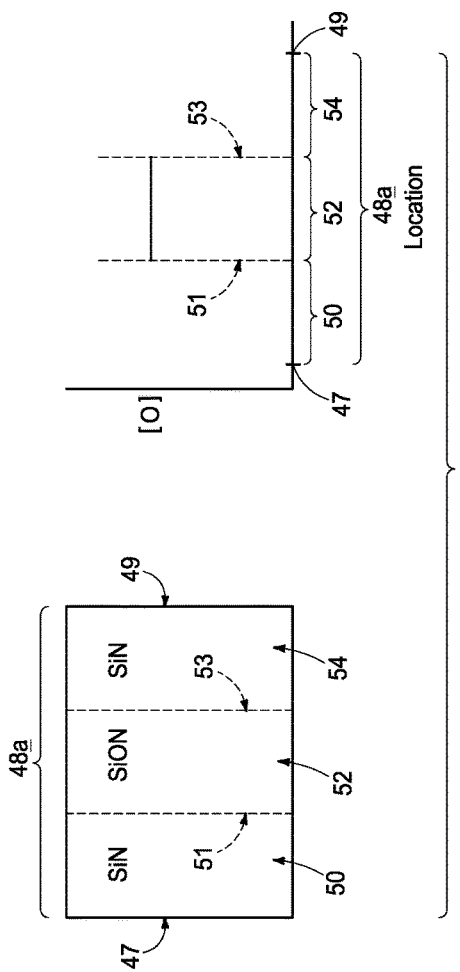
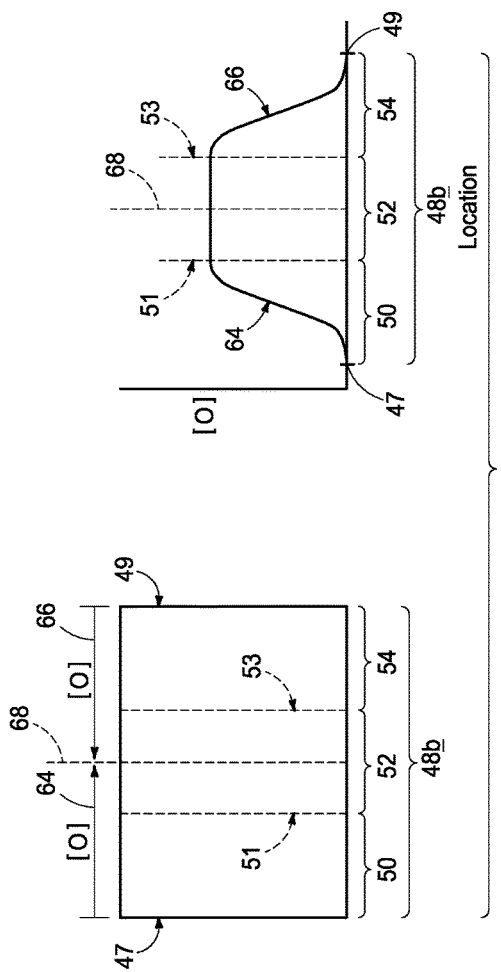
FIG. 2
FIG. 3

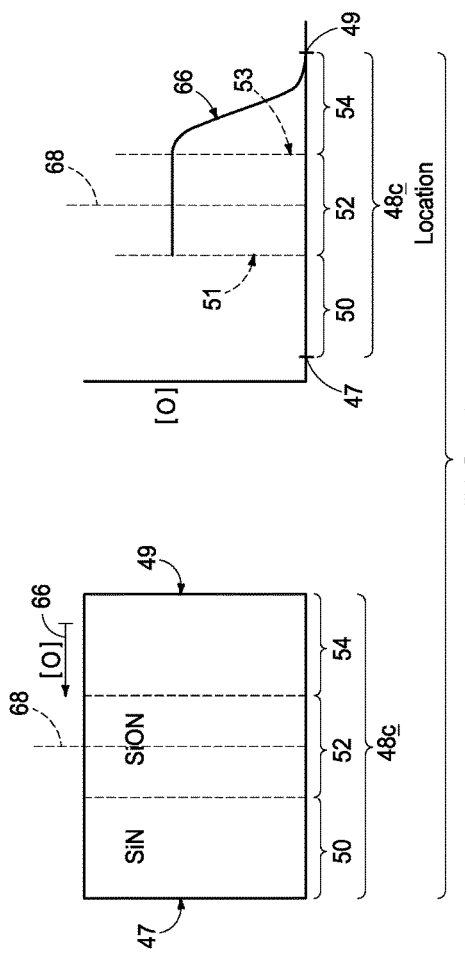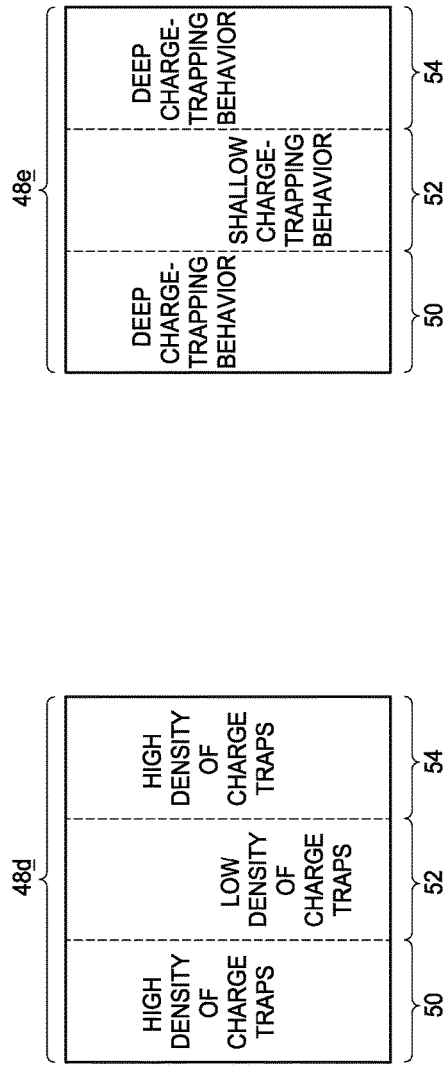
FIG. 4
FIG. 5
FIG. 6

US 10,388,667 B2

MEMORY CELLS, INTEGRATED STRUCTURES AND MEMORY ARRAYS

RELATED PATENT DATA

This patent resulted from a continuation of U.S. patent application Ser. No. 15/409,412 which was filed Jan. 18, 2017 and which is hereby incorporated by reference herein.

TECHNICAL FIELD

Memory cells, integrated structures and memory arrays.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells. It is desired to develop improved NAND architecture.

BRIEF DESCRIPTION OF THE DRAWINGS

FIG. 2 is a diagrammatic cross-sectional side view of an example charge-passage structure (left side), and a graphical illustration (right side) of oxygen concentration relative to location across the charge-passage structure.

FIG. 3 is a diagrammatic cross-sectional side view of another example charge-passage structure (left side), and a graphical illustration (right side) of oxygen concentration relative to location across the charge-passage structure.

FIG. 4 is a diagrammatic cross-sectional side view of another example charge-passage structure (left side), and a graphical illustration (right side) of oxygen concentration relative to location across the charge-passage structure.

FIG. 5 is a diagrammatic cross-sectional side view of another example charge-passage structure.

FIG. 6 is a diagrammatic cross-sectional side view of another example charge-passage structure.

DETAILED DESCRIPTION OF THE ILLUSTRATED EMBODIMENTS

Figure 1:
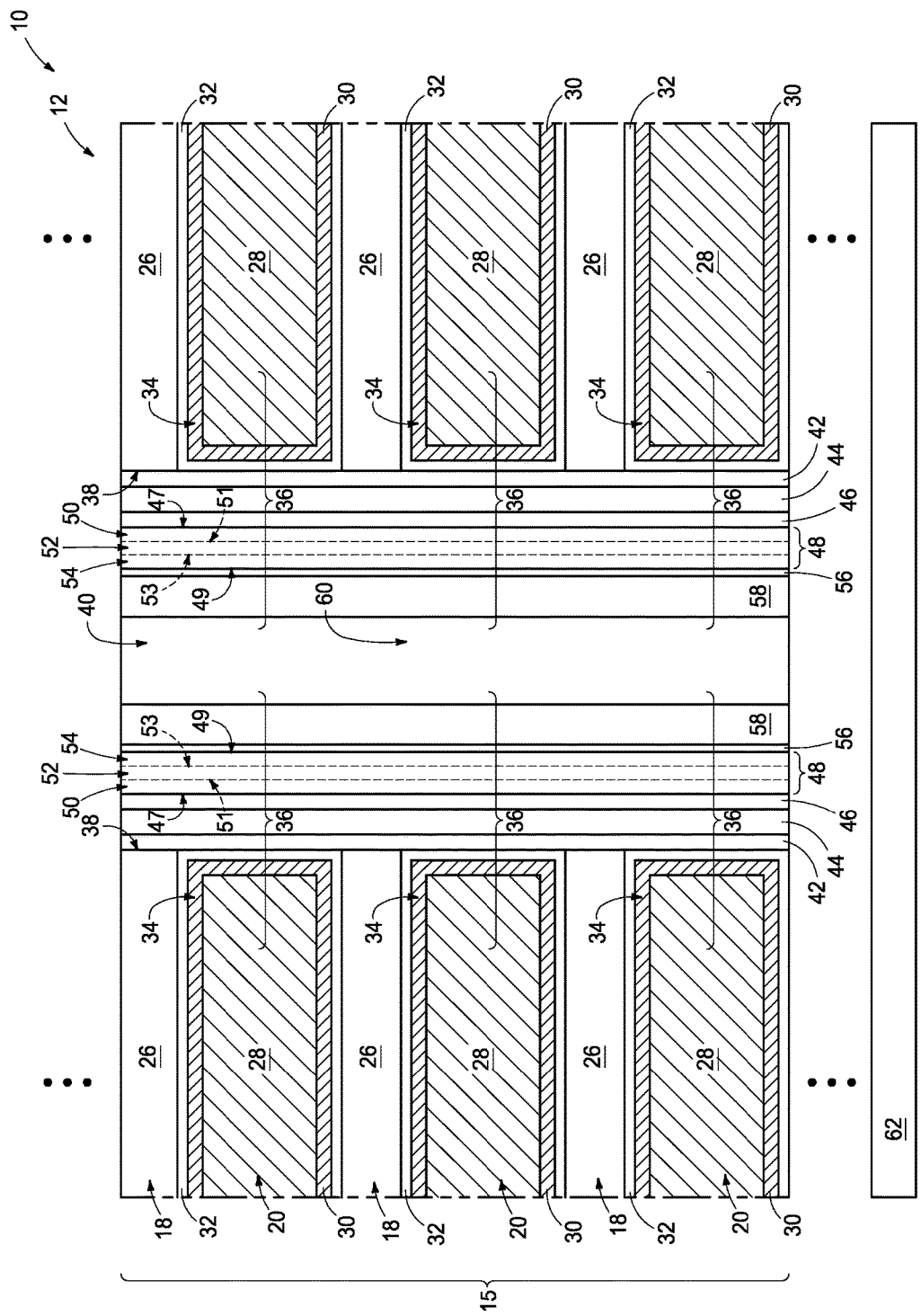
FIG. 1 is a diagrammatic cross-sectional side view of an example integrated structure having a region of an example NAND memory array.

Operation of NAND memory cells comprises movement of charge between a channel material and a charge-storage material; with movement of the "charge" corresponding to movement of charge carriers (i.e., electrons and holes). For instance, programming of a NAND memory cell may comprise moving charge (i.e., electrons) from the channel material into the charge-storage material, and then storing the charge within the charge-storage material. Erasing of the NAND memory cell may comprise moving holes into the charge-storage material to recombine with electrons stored in the charge-storage material, and thereby release charge from the charge-storage material. The charge-storage material may comprise charge-trapping material (for instance, silicon nitride, metal dots, etc.) which reversibly traps charge carriers. It is desired that the charge-trapping material have appropriate charge-trapping probability and/or charge-trapping rate in order that charge carriers are effectively trapped and retained within the charge-trapping material. Charge-trapping probability and charge-trapping rate of a particular charge-trapping material may be related to the volumetric density of charge traps within charge-trapping material, the energy of the charge traps (i.e., the depths of the charge traps in energy wells), etc.

Channel material may be separated from charge-storage material by insulative material, and such insulative material may be characterized by an effective oxide thickness (EOT). It can be desired that the insulative material have sufficient EOT to preclude undesired back-migration (i.e., leakage) of charges from the charge-storage material to the channel material. However, increasing EOT can increase the difficulty of removing trapped charges from materials having relatively deep charge traps. It is therefore desired to engineer insulative materials suitable for spacing charge-storage material from channel material to achieve desired EOT for precluding undesired leakage, while also permitting deeply-trapped charges to be removed during an ERASE operation. Some embodiments include improved NAND memory cells which incorporate bandgap-engineered charge-passage structures within the insulative material between charge-storage structures and channel material. Example embodiments are described with reference to FIGS. 1-6.

Referring to FIG. 1, a portion of an integrated structure 10 is illustrated, with such portion being a fragment of a three-dimensional NAND memory array 12.

The integrated structure 10 comprises a stack 15 of alternating first and second levels 18 and 20. The levels 18 are insulative (i.e. dielectric), and the levels 20 are conductive.

The insulative levels 18 comprise insulative material 26. Such insulative material may comprise any suitable composition or combination of compositions; and may, for example, comprise silicon dioxide.

The conductive levels 20 comprise conductive materials 28 and 30. The conductive material 28 may be considered to be a conductive core, and the conductive material 30 may be considered to be an outer conductive layer surrounding the conductive core. The conductive materials 28 and 30 may comprise different compositions than one another. In some embodiments, the conductive material 28 may comprise, consist essentially of, or consist of one or more metals (for instance, tungsten, titanium, etc.), and the conductive material 30 may comprise, consist essentially of, or consist of one or more metal-containing compositions (for instance, metal nitride, metal silicide, metal carbide, etc.). In some embodiments, the conductive core material 28 may comprise, consist essentially of, or consist of one or more metals (for instance, tungsten, titanium, etc.), and the surrounding conductive material 30 may comprise, consist essentially of, or consist of one or more metal nitrides (for instance, titanium nitride, tungsten nitride, etc.).

Insulative material 32 forms an insulative liner surrounding the outer conductive layer of material 30. The insulative material 32 may comprise high-k material (for instance, aluminum oxide); where the term "high-k" means a dielectric constant greater than that of silicon dioxide.

The materials 28/30 illustrate an example configuration of the conductive levels 20. In other embodiments, the conductive levels 20 may comprise other configurations of conductive material. Generally, the conductive levels 20 may comprise conductive material having any suitable composition or combination of compositions; and may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.).

In some embodiments, the conductive levels 20 may be considered to be wordline levels of a NAND memory array. Terminal ends 34 of the wordline levels 20 may function as control gates of NAND memory cells 36, with approximate locations of the memory cells 36 being indicated with brackets in FIG. 1.

The conductive levels 20 and insulative levels 18 may be of any suitable vertical thicknesses. In some embodiments, the conductive levels 20 and the insulative levels 18 may have vertical thicknesses within a range of from about 10 nanometers (nm) to about 300 nm. In some embodiments, the conductive levels 20 may have about the same vertical thicknesses as the insulative levels 18. In other embodiments, the conductive levels 20 may have substantially different vertical thicknesses than the insulative levels 18.

The vertically-stacked memory cells 36 form a vertical string (such as, for example, a vertical NAND string of memory cells), with the number of memory cells in each string being determined by the number of conductive levels 20. The stack may comprise any suitable number of conductive levels. For instance, the stack may have 8 conductive levels, 16 conductive levels, 32 conductive levels, 64 conductive levels, 512 conductive levels, 1028 conductive levels, etc.

In the shown embodiment, the insulative materials 26 and 32 together form vertical sidewalls 38. The vertical sidewalls 38 may be considered to be sidewalls of an opening 40 extending through stack 15. The opening 40 may have a continuous shape when viewed from above; and may be, for example, circular, elliptical, etc. Accordingly, the sidewalls 38 of FIG. 1 may be comprised by a continuous sidewall that extends around the periphery of opening 40.

Charge-blocking material 42 extends vertically along the sidewalls 38, and is adjacent the terminal ends 34 of wordline levels 20. The charge-blocking material 42 forms charge-blocking regions of the memory cells 30. The charge-blocking material 42 may comprise any suitable composition or combination of compositions; including, for example, silicon dioxide, one or more high-k dielectric materials, etc. In some embodiments, the insulative material 32 and charge-blocking material 42 together form charge-blocking regions of the memory cells 36. A charge block may have the following functions in a memory cell: in a program mode, the charge block may prevent charge carriers from passing out of the charge-storage material (e.g., floating-gate material, charge-trapping material, etc.) toward the control gate; and in an erase mode, the charge block may prevent charge carriers from flowing into the charge-storage material from the control gate.

Charge-storage material 44 extends vertically along the charge-blocking material 42. The charge-storage material 44 may comprise any suitable composition or combination of compositions; and in some embodiments, may comprise floating gate material (for instance, doped or undoped silicon) or charge-trapping material (for instance, silicon nitride, metal dots, etc.). In some embodiments, the charge-storage material 44 may comprise, consist essentially of, or consist of silicon nitride. In some embodiments, the charge-storage material 44 may consist of silicon nitride, and may have a horizontal thickness within a range of from about 50 Å to about 80 Å.

Insulative material 46 extends vertically along the charge-storage material 44. The insulative material 46 may comprise any suitable composition or combination of compositions; and in some embodiments, comprises one or more oxides (such as, for example, silicon dioxide, etc.). The insulative material 46 may comprise any suitable horizontal thickness; and in some embodiments, may comprise a horizontal thickness within a range of from about 10 Å to about 30 Å.

A charge-passage structure 48 extends vertically along the insulative material 46. The charge-passage structure has a central region 52 sandwiched between a first region 50 and a second region 54. A dashed line 51 is provided to diagrammatically illustrate an approximate boundary between the first region 50 and the central region 52, and a dashed line 53 is provided to diagrammatically illustrate an approximate boundary between the second region 54 and the central region 52. In the shown embodiment, the regions 50, 52 and 54 are all approximately the same horizontal width as one another. In other embodiments, one or more of the regions 50, 52 and 54 may be of a different horizontal width as compared to others of the regions 50, 52 and 54.

The central region 52 has a lower charge-trapping probability (and/or a lower charge-trapping rate) as compared to the first and second regions 50 and 54. The lower charge-trapping probability (and/or the lower charge-trapping rate) may be related to the central region 52 having a lower volumetric density of charge traps than the first and second regions 50 and 54; and/or may be related to the central region 52 exhibiting shallower charge-trapping behavior as compared the first and second regions 50 and 54.

In embodiments in which the central region 52 exhibits shallower charge-trapping behavior than the first and second regions 50 and 54, the charge-trapping behavior exhibited by each of the regions 50, 52 and 54 may be averaged behavior across charge trap of the individual regions. Accordingly, regions 50 and 54 may each have some shallow charge traps, and region 52 may have some deep charge traps; but, on average, region 52 exhibits shallower charge-trapping behavior than regions 50 and 54.

In some embodiments, the central region 52 comprises silicon oxynitride, and the first and second regions 50/54 consist of silicon nitride. In some embodiments, the first region 50, second region 54 and central region 52 all comprise silicon and nitrogen, and additionally the central region 52 comprises a higher total concentration of oxygen than either of the first and second regions 50/54. The first and second regions 50 and 54 of the charge-passage structure 48 may be the same composition as one another, or may be different compositions relative to one another. It can be desired for the central region to comprise silicon in combination with both nitrogen and oxygen, as opposed to the central region comprising only silicon nitride, in order to alleviate parasitic trapping that may be associated with silicon nitride.

The charge-passage structure 48 may comprise any suitable horizontal thickness. In some embodiments, a total horizontal thickness of the charge-passage structure 48 may be within a range of from about 20 Å to about 150 Å. In such embodiments, the central region 52 may have a thickness within a range of from about one monolayer to about 70 Å. In some embodiments, a total horizontal thickness of the charge-passage structure 48 may be within a range of from about 20 Å to about 100 Å, and the central region 52 may comprise a horizontal thickness within a range of from about 10 Å to about 30 Å.

Gate-dielectric material 56 extends vertically along the charge-passage structure 48. The gate-dielectric material 56 may comprise any suitable composition or combination of compositions; and in some embodiments, may comprise, consist essentially of, or consist of silicon dioxide. The gate-dielectric material can function as a material through which charge carriers tunnel or otherwise pass during programming operations, erasing operations, etc. In some contexts, the gate-dielectric material may be referred to simply as an insulative material or a dielectric material.

In some embodiments, the insulative material 46 and gate-dielectric material 56 both comprise oxide (for instance, both may comprise, consist essentially of, or consist of silicon dioxide), and are referred to as first and second oxides, respectively. In such embodiments, the first oxide 46 is directly against a first side 47 of the charge-passage structure 48, and the second oxide 56 is directly against a second side 49 of the charge-passage structure 48; with the second side 49 of the charge-passage structure 48 being in opposing relation to the first side 47 of the charge-passage structure 48. In some embodiments, the first and second oxides 46 and 56 may have substantially the same horizontal thickness as one another (with the term "substantially the same" meaning the same to within reasonable tolerances of fabrication and measurement), and in other embodiments the first and second oxides 46 and 56 may have different horizontal thicknesses relative to one another.

Channel material 58 extends vertically along the gate-dielectric material 56. The channel material 58 may comprise any suitable composition or combination of compositions; and in some embodiments may comprise, consist essentially of, or consist of appropriately-doped silicon.

In the illustrated embodiment, an insulative region 60 extends along a middle of opening 40. The insulative region 60 may comprise any suitable insulative composition; including, for example, silicon dioxide, silicon nitride, etc. Alternatively, at least a portion of the insulative region 60 may be a gas-filled void. The illustrated embodiment having the insulative region 60 extending down the middle of opening 40 is a so-called hollow-channel configuration. In other embodiments, the channel material 58 may entirely fill the central region of opening 40 to form a vertically-extending pedestal within such central region.

The stack 15 is supported by a base 62. A break is provided between the base 62 and the stack 15 to indicate that there may be additional materials and/or integrated circuit structures between the base 62 and the stack 15. In some applications, such additional integrated materials may include, for example, source-side select gate material (SGS material).

The base 62 may comprise semiconductor material; and may, for example, comprise, consist essentially of, or consist of monocrystalline silicon. The base 62 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 62 may correspond to a semiconductor substrate containing one or more materials associated with integrated circuit fabrication. Such materials may include, for example, one or more of refractory metal materials, barrier materials, diffusion materials, insulator materials, etc.

The charge-passage structure 48 is engineered to have appropriate bandgap properties, etc. to provide sufficient EOT to preclude undesired back-migration (i.e., leakage) of charges from the charge-storage material 44 to the channel material 58, while also permitting deeply-trapped charges within the charge-storage material 44 to be removed from material 44 (i.e., transferred from charge-storage material 44 to channel material 58) during an ERASE operation. Some example embodiments of the charge-passage structure 48 are described with reference to FIGS. 2-6.

Referring to FIG. 2, an example charge-passage structure 48a has a central region 52 comprising silicon oxynitride (diagrammatically shown as SiON, where the formula indicates primary constituents rather than a specific stoichiometry), and has the first and second regions 50/54 comprising silicon nitride (diagrammatically shown as SiN, where the formula indicates primary constituents rather than a specific stoichiometry). The right side of FIG. 2 graphically illustrates oxygen concentration [O] as a function of the location across charge-passage structure 48a, and shows that oxygen is only within the central region 52.

FIG. 3 shows another example charge-passage structure 48b, and shows that oxygen concentration [O] increases in progressing inwardly from surfaces 47/49 toward the center of the charge-passage structure 48b. In some embodiments, surfaces 47/49 may have no measurable oxygen (e.g. may consist of silicon nitride). The oxygen concentration may ramp in any suitable gradient(s) across the first and second regions 50/54. The oxygen-concentration gradient across the first region 50 may be referred to as a first oxygen-concentration gradient 64, and the oxygen-concentration gradient across the second region 52 may be referred to as a second oxygen-concentration gradient 66.

The central region 52 comprises a total concentration of oxygen which is greater than the total concentration of oxygen in either of the regions 50 and 54. In some embodiments, the central region may comprise, consist essentially of, or consist of, silicon, nitrogen and oxygen.

The right side of FIG. 3 graphically illustrates oxygen concentration [O] as a function of location across charge-passage structure 48b. Notably, in the illustrated embodiment the first and second oxygen-concentration gradients 64 and 66 are substantially mirror images of one another. Accordingly, the charge-passage structure 48b is substantially mirror symmetric about a plane 68 through the middle of the central region 52 and midway between the first and second surfaces 47 and 49. The term "substantially mirror symmetric" means mirror symmetric to within reasonable tolerances of fabrication and measurement.

In some embodiments, the charge-passage structure (e.g., 48 of FIG. 1) will not be mirror symmetric about a plane through the middle of the central region 52. Such may be due to different horizontal thicknesses of the first and second regions 50 and 54 relative to one another, and/or to different compositions within regions 50 and 54. FIG. 4 shows an example charge-passage structure 48c having a different composition within the first region 50 as compared to the second region 54. Specifically, the first region 50 comprises no measurable oxygen, and is shown consisting of silicon and nitrogen (illustrated as SiN, where the formula indicates primary constituents rather than a specific stoichiometry); and the second region 54 comprises an oxygen gradient 66 of the type described above with reference to FIG. 3. Accordingly, the charge-passage structure 48*c* is not mirror symmetric about the plane 68 through the middle of the central region 52 and midway between the first and second surfaces 47 and 49. Such is also graphically illustrated on the right side of FIG. 4 with a graph of oxygen concentration [O] as a function of location across charge-passage structure 48*c*.

In some embodiments, the charge-passage structures (e.g., 48/48*a*/48*b*/48*c*) may be considered to comprise a central region 52 having a lower charge-trapping probability than first and second outer regions 50 and 54. In some embodiments, the charge-passage structures (e.g., 48/48*a*/48*b*/48*c*) may be considered to comprise a central region 52 having a lower charge-trapping rate than first and second outer regions 50 and 54. The charge-trapping probabilities and/or the charge-trapping rates of the charge-trapping regions 50, 52 and 54 may be related to the volumetric density of charge traps within charge-trapping materials of such regions and/or to the charge-trapping behavior exhibited by the charge-trapping materials of such regions.

For instance, in some embodiments the charge-trapping probabilities and/or the charge-trapping rates of the charge-trapping regions 50, 52 and 54 are related to the volumetric density of charge traps within charge-trapping materials of such regions. In such embodiments, the charge-passage structures (e.g., 48/48*a*/48*b*/48*c*) may be considered to comprise a central region 52 having relatively low volumetric density of charge traps between a first region 50 having first relatively high volumetric density of charge traps, and a second region 54 having second relatively high volumetric density of charge traps. Such is diagrammatically illustrated with reference to a charge-passage structure 48*d* of FIG. 5. The volumetric density of charge traps in the first region 50 may be the same as the that in the second region 54, or may be different than that of the second region 54.

As another example, in some embodiments the charge-trapping probabilities and/or the charge-trapping rates of the charge-trapping regions 50, 52 and 54 are related to the charge-trapping behavior exhibited by the charge-trapping materials of such regions. In such embodiments, the charge-passage structures (e.g., 48/48*a*/48*b*/48*c*) may be considered to comprise a central region 52 which exhibits relatively-shallow-charge-trapping behavior between a first region 50 exhibiting relatively-deep-charge-trapping behavior, and a second region 54 exhibiting relatively-deep-charge-trapping behavior. Such is diagrammatically illustrated with reference to a charge-passage structure 48*e* of FIG. 6. The charge-trapping behavior exhibited by regions 50 and 54 may be the same in some embodiments, or may be different in other embodiments (for instance, regions 50 and 54 may differ in one or more of the trapping energy, the concentration of charge traps per unit volume, the total number of charge traps, etc.).

The charge-passage structures 48/48*a*/48*b*/48*c*/48*d* may advantageously improve operational characteristics of a NAND memory as compared to conventional NAND memory lacking such charge-passage structures. For instance, the charge-passage structures 48/48*a*/48*b*/48*c*/48*d* may be tailored to enable desired retention of charge on charge-storage material (e.g., charge-storage material 44 of FIG. 1) to alleviate or prevent leakage, while also enabling rapid and relatively complete removal of charge from the charge-storage material during erasing operations. In some embodiments, the charge-passage structures 48/48*a*/48*b*/48*c*/48*d* may advantageously enable improved erase performance of NAND memory as compared to conventional NAND memory lacking such charge-passage structures, without negatively impacting quick charge loss (QCL).

The structures and assemblies described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory cell comprising, in the following order; a control gate, charge-blocking material, charge-trapping material, a first oxide, a charge-passage structure, a second oxide, and channel material. The charge-passage structure has a central region sandwiched between first and second regions. The central region has a lower probability of trapping charges and/or a lower rate of trapping charges than the first and second regions.

Some embodiments include an integrated structure comprising a vertical stack of alternating conductive levels and insulative levels. Charge-blocking material extends vertically along the vertical stack. Charge-storage material extends vertically along the charge-blocking material. An insulative material extends vertically along the charge-storage material. A charge-passage structure extends vertically along the insulative material, and has a central region sandwiched between first and second regions. The central region having a lower probability of trapping charges and/or a lower rate of trapping charges than the first and second regions. Dielectric material extends vertically along the charge-passage structure. Channel material extends vertically along the dielectric material.

Some embodiments include a NAND memory array comprising a vertical stack of alternating insulative levels and wordline levels. Each of the wordline levels comprises a conductive core surrounded by an outer conductive layer. The conductive core comprises a different composition than the outer conductive layer. Charge-blocking material extends vertically along the vertical stack. Charge-storage material extends vertically along the charge-blocking material. An insulative material extends vertically along the charge-storage material. A charge-passage structure extends vertically along the insulative material, and has a central region sandwiched between first and second regions. The central region exhibiting shallower charge-trapping behavior than the first and second regions. Channel material extends vertically along the dielectric material.

Some embodiments include a NAND memory array comprising a vertical stack of alternating insulative levels and wordline levels. Each of the wordline levels comprises a conductive core surrounded by an outer conductive layer. The conductive core comprises a different composition than the outer conductive layer. Charge-blocking material extends vertically along the vertical stack. Charge-storage material extends vertically along the charge-blocking material. An insulative material extends vertically along the charge-storage material. A charge-passage structure extends vertically along the insulative material, and has a central region sandwiched between first and second regions. The central region having a lower volumetric density of charge traps than the first and second regions. Channel material extends vertically along the dielectric material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising, in the following order:
a control gate;
charge-blocking material;
charge-trapping material;
a first oxide;
a charge-passage having a first outer surface along the first oxide and a second outer surface opposing the first outer surface, the charge-passage structure consisting of a central region sandwiched between first and second regions, each of the first region, second region and central region containing nitrogen, with at least one of the first and second outer surfaces consisting of silicon nitride; the central region containing a higher concentration of oxygen than the first and second regions and having a lower probability of trapping charges and/or a lower rate of trapping charges than the first and second regions;
a second oxide; and
channel material.

2. The memory cell of claim 1 wherein the central region has a lower volumetric density of charge traps than the first and second regions.

3. The memory cell of claim 1 wherein the central region exhibits shallower charge-trapping behavior than the first and second regions.

4. The memory cell of claim 1 wherein the central region has a lower volumetric density of charge traps than the first and second regions; and wherein the central region exhibits shallower charge-trapping behavior than the first and second regions.

5. The memory cell of claim 1 wherein the first and second regions are a same composition as one another.

6. The memory cell of claim 1 wherein the first and second regions are not a same composition as one another.

7. The memory cell of claim 1 wherein the first and second outer surfaces consist of silicon nitride; and wherein the central region comprises SiON, where the formula indicates primary components rather than a specific stoichiometry.

8. The integrated structure of claim 7 wherein the central region has a lower volumetric density of charge traps than the first and second regions; and wherein the central region exhibits shallower charge-trapping behavior than the first and second regions.

9. A memory cell, comprising, in the following order:
a control gate;
charge-blocking material;
charge-trapping material;
a first oxide;
a charge-passage structure consisting of a central region sandwiched between first and second regions, each of the first region, second region and central region containing nitrogen; the central region containing a higher concentration of oxygen than the first and second regions and having a lower probability of trapping charges and/or a lower rate of trapping charges than the first and second regions, the charge-passage structure having a first outer surface along the first region, and having a second outer surface in opposing relation to the first outer surface and along the second region; wherein the first and second outer surfaces consist of silicon nitride; and wherein the central region comprises SiON, where the formula indicates primary components rather than a specific stoichiometry;
a second oxide; and
channel material; wherein the charge-passage structure comprises a first gradient of increasing oxygen concentration extending along a direction from the first surface to the central region, and comprises a second gradient of increasing oxygen concentration extending from the second surface to the central region.

10. The memory cell of claim 9 wherein the charge-passage structure is substantially mirror symmetric about a plane through the middle of the central region and midway between the first and second surfaces.

11. An integrated structure, comprising:
a vertical stack of alternating conductive levels and insulative levels;
charge-blocking material extending vertically along the vertical stack;
charge-storage material extending vertically along the charge-blocking material;
an insulative material extending vertically along the charge-storage material; and a charge-passage structure having a first outer surface extending vertically along the insulative material and a second outer surface opposing the first outer surface, the charge-passage structure having a central region sandwiched between and in direct physical contact with first and second regions, each of the first region, the second region and central region containing nitrogen, with at least one of the first and second outer surfaces consisting of silicon nitride; the central region containing a higher concentration of oxygen than the first and second regions and having a lower probability of trapping charges and/or a lower rate of trapping charges than the first and second regions.

12. The integrated structure of claim 11 wherein the central region has a lower volumetric density of charge traps than the first and second regions.

13. The integrated structure of claim 11 wherein the central region exhibits shallower charge-trapping behavior than the first and second regions.

14. A NAND memory array, comprising:
a vertical stack of alternating insulative levels and word-line levels;
charge-blocking material extending vertically along the vertical stack;
charge-storage material extending vertically along the charge-blocking material;
an insulative material extending vertically along the charge-storage material; and
a charge-passage structure having a first outer surface extending vertically along the insulative material, and having a second outer surface in opposing relation to the first outer surface, the charge-passage structure consisting of a central region sandwiched between first and second regions, each of the first region, the second region and the central region containing nitrogen with at least one of the first and second outer surfaces consisting of silicon nitride; the central region containing a higher concentration of oxygen than the first and second regions and exhibiting shallower charge-trapping behavior than the first and second regions.

15. The NAND memory array of claim 14 wherein the central region, first region and second region all comprise silicon and nitrogen; and wherein the central region comprises a higher oxygen concentration than the first and second regions.

16. The NAND memory array of claim 14 wherein the first and second regions consist of silicon nitride; and wherein the central region comprises silicon oxynitride.

17. The NAND memory array of claim 14 wherein the first and second outer surfaces consist of silicon nitride; and wherein the central region comprises SiON, where the formula indicates primary components rather than a specific stoichiometry.

18. The NAND memory array of claim 17 wherein the charge-passage structure is substantially mirror symmetric about a plane through the middle of the central region and midway between the first and second surfaces.

19. The NAND memory array of claim 17 wherein the charge-passage structure is not mirror symmetric about a plane through the middle of the central region and midway between the first and second surfaces.

20. A NAND memory array, comprising:
a vertical stack of alternating insulative levels and word-line levels;
charge-blocking material extending vertically along the vertical stack;
charge-storage material extending vertically along the charge-blocking material;
an insulative material extending vertically along the charge-storage material;
a charge-passage structure extending vertically along the insulative material, the charge-passage structure having a first outer surface along the insulative material and a second outer surface opposing the first outer surface, at least one of the first and second outer surfaces consisting of silicon nitride; the charge-passage structure further having a central region sandwiched between and in direct physical contact with first and second regions, each of the first, second and central regions containing nitrogen; the central region containing a higher concentration of oxygen than the first and second regions and having a lower volumetric density of charge traps than the first and second regions; and
dielectric material extending vertically along the charge-passage structure.

* * * * *